(12) United States Patent
Mann

(10) Patent No.: US 9,639,004 B2
(45) Date of Patent: May 2, 2017

(54) IMAGING OPTICS AND PROJECTION EXPOSURE INSTALLATION FOR MICROLITHOGRAPHY WITH AN IMAGING OPTICS

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1625 days.

(21) Appl. No.: 13/218,962

(22) Filed: Aug. 26, 2011

(65) Prior Publication Data
US 2012/0008125 A1    Jan. 12, 2012

Related U.S. Application Data

(63) Continuation of application No. PCT/EP2010/001203, filed on Feb. 26, 2010.

(60) Provisional application No. 61/157,956, filed on Mar. 6, 2009.

(51) Int. Cl.
*G03B 27/54*   (2006.01)
*G03F 7/20*    (2006.01)
*G02B 17/06*   (2006.01)

(52) U.S. Cl.
CPC ..... *G03F 7/70233* (2013.01); *G02B 17/0652* (2013.01); *G02B 17/0657* (2013.01)

(58) Field of Classification Search
CPC .......................... G03F 7/70233; G02B 17/0652
See application file for complete search history.

(56) References Cited

U.S. PATENT DOCUMENTS

| 6,750,948 B2 | 6/2004 | Omura |
| 2006/0232867 A1 | 10/2006 | Mann et al. |
| 2008/0118849 A1 | 5/2008 | Chandhok et al. |

FOREIGN PATENT DOCUMENTS

| EP | 1 209 503 A2 | 5/2002 |
| EP | 1 209 503 B1 | 1/2009 |
| JP | 2008-533709 | 8/2005 |

(Continued)

OTHER PUBLICATIONS

Chinese office action, with English translation, for CN Application No. 2010 8001 0584.0, dated Jan. 12, 2015.

(Continued)

*Primary Examiner* — Chia-How Michael Liu
(74) *Attorney, Agent, or Firm* — Fish & Richardson P.C.

(57) ABSTRACT

An imaging optics has at least six mirrors, which image an object field in an object plane in an image field in an image plane. An entry pupil of the imaging optics is arranged in the imaging beam path in front of the object field. At least one of the mirrors has a through-opening for the passage of imaging light. A mechanically accessible pupil, in which an obscuration stop is arranged for the central shading of the pupil of the imaging optics, is located in a pupil plane in the imaging beam path between the object field and a first of the through-openings. A first imaging part beam directly after a second mirror in the imaging beam path after the object field and a second imaging part beam directly after a fourth mirror in the imaging beam path after the object field intersect one another in an intersection region. The result is an imaging optics, in which a handleable combination of small imaging errors, manageable production and a good throughput for the imaging light is achieved.

20 Claims, 5 Drawing Sheets

(56) References Cited

FOREIGN PATENT DOCUMENTS

JP         2008-525831      7/2008
WO   WO 2006/099899 A2   9/2006

OTHER PUBLICATIONS

Chinese office action, with English translation thereof, For CN Appl No. 2010 8001 0584.0, dated Jan. 30, 2013.
The International Search Report for the corresponding PCT Application No. PCT/EP2010/001203, mailed May 18, 2010.
Korean Office Action, with translation thereof, for corresponding KR Appl No. 10-2011-7023514, dated Aug. 26, 2013.
Japanese office action, with English translation, for corresponding JP Appl No. 2011-552347, dated Sep. 4, 2014.
Japanese office action, with English translation, for corresponding JP Appl No. 2011-552347, dated Nov. 12, 2013.

IMAGING OPTICS AND PROJECTION EXPOSURE INSTALLATION FOR MICROLITHOGRAPHY WITH AN IMAGING OPTICS

CROSS-REFERENCE TO RELATED APPLICATIONS

This application is a continuation of, and claims benefit under 35 USC 120 to, international application PCT/EP2010/001203, filed Feb. 26, 2010, which claims benefit under 35 USC 119(e) of U.S. Ser. No. 61/157,956, filed Mar. 6, 2009. International application PCT/EP2010/001203 is hereby incorporated by reference in its entirety.

FIELD

The disclosure relates to an imaging optics with a plurality of mirrors, which image an object field in an object plane in an image field in an image plane. Furthermore, the disclosure relates to a projection exposure installation with an imaging optics of this type, a method of producing a microstructured or nanostructured component with a projection exposure installation of this type and a microstructured or nanostructured component produced by this method.

BACKGROUND

Imaging optics are known from US 2006/0232867 A1, US 2008/0118849 A1 and U.S. Pat. No. 6,750,948 B2.

SUMMARY

The disclosure provides an imaging optics that has a handleable combination of small imaging errors, manageable production and good throughput for the imaging light.

In one aspect, the disclosure provides an imaging optics with at least six mirrors, which image an object field in an object plane into an image field in an image plane, wherein: chief rays, which emanate from points of the object field which are spaced apart from one another, have a mutually diverging beam course; at least one of the mirrors has a through-opening for the passage of imaging light; located in the imaging beam path between the object field and a first of the through-openings in a pupil plane is a pupil through which the imaging light passes once and in which an obscuration stop is arranged for central shading of an exit pupil of the imaging optics; and a first imaging part beam directly after a second mirror in the imaging beam path after the object field and a second imaging part beam directly after a fourth mirror in the imaging beam path after the object field intersect one another in an intersection region.

The intersection region of the two imaging part beams provides the possibility of a compact beam course in the region of the third and fourth mirror in the imaging beam path. Free installation space can then be provided in the beam path in front of the intersection region. In this part of the imaging beam path, which is free because of the spacing from further imaging part beams, the pupil which is mechanically accessible and passed through once can be arranged in a pupil plane, so the arrangement of the obscuration stop is possible without shading or substantially without shading of other imaging part beams and is therefore vignette-free. A pupil of an imaging optics is generally taken to mean all the images of the aperture stop, which delimits the imaging beam path. The planes, in which these images come to rest, are called the pupil planes. As, however, the images of the aperture stop are not inevitably precisely planar, as a generalisation, the planes, which approximately correspond to these images, are also called pupil planes. The plane of the aperture stop itself is also called a pupil plane. If the aperture stop is not planar, as in the images of the aperture stop, the plane which best corresponds to the aperture stop is called the pupil plane.

The entry pupil of the imaging optics is taken to mean the image of the aperture stop which is produced if the aperture stop is imaged by the part of the imaging optics which is located between the object plane and aperture stop. Accordingly, the exit pupil is the image of the aperture stop which is produced if the aperture stop is imaged by the part of the imaging optics which is located between the image plane and aperture stop.

If the entry pupil is a virtual image of the aperture stop, in other words the entry pupil plane is located in front of the object field, a negative back focus of the entry pupil is referred to. In this case, the chief rays extend to all object field points as if they were to come from a point in front of the imaging beam path. The chief ray or main beam to each object point is defined as the connecting beam between the object point and the centre point of the entry pupil. In the case of a negative back focus of the entry pupil, the chief rays to all the object points therefore have a divergent beam course at the object field.

A shaded or obscured exit pupil at an image element is present if this image element cannot be reached by all beams which emanate from the associated object point within the aperture. There is thus a region within the exit pupil, which no beams can reach from this image element. This region is called the pupil obscuration.

An alternative definition of a pupil is that region in the imaging beam path of the imaging optics, in which individual beams issuing from the object field points intersect, which, relative to the chief rays issuing from these object field points, are associated with the same illumination angle in each case. The plane can be called the pupil plane, in which the intersection points of the individual beams are located according to the alternative pupil definition, or which comes closest to the spatial distribution of these intersection points, which do not inevitably have to be located precisely in a plane.

A pupil is mechanically accessible, free of vignettes, if it is possible to shade and/or de-limit the pupil in portions and/or at the edge by a stop structure in the pupil plane associated with this pupil, without otherwise influencing the beam path. The entry pupil arranged in the imaging beam path in front of the object field, in other words outside the imaging beam path between the object field and the image field provides the possibility of illuminating the object field of the imaging optics with an illumination optics having only a few components, which helps to minimise imaging light losses. A free installation space, which surrounds the mechanically accessible pupil, may have an extent around the aperture of the pupil which is 0.25 times, 0.5 times, 0.75 times or 1.0 times the diameter of the mechanically accessible pupil, in other words the diameter of the free aperture. Even greater installation spaces may be present in the mechanically accessible pupil according to the disclosure.

An imaging optics can allow a particularly advantageous combination of small imaging errors, manageable production and good imaging light throughput.

Not only can the pupil obscuration be predetermined by the arrangement of an aperture stop, but also an outer form of the pupil passed through once or of the mechanically accessible pupil. The obscuration stop, on the one hand, and the aperture stop, on the other hand, may be stop regions of precisely one stop unit arranged in the region of the mechanically accessible pupil.

An arrangement of the pupil passed through once or of the mechanically accessible pupil can lead to the possibility of a pupil which can be accessed particularly well mechanically.

An arrangement can provide, between the second mirror and the object field, installation space, which can be used, for example, for the arrangement of a component of an illumination optics to illuminate the object field.

Two intermediate image planes may be arranged in regions of the imaging beam path, in which a beam bundle of imaging light with a relatively small diameter is decisive.

Arrangements of the intermediate image planes can have proven to be particularly suitable for the compact guidance of the imaging light. The first intermediate image plane may be located in a region of the imaging beam path, in which the imaging light is guided past one of the mirrors of the imaging optics. The second intermediate image plane may be arranged in the region of a through-opening of one of the mirrors for the passage of the imaging light.

In some embodiments, the imaging optics has a central pupil obscuration of at most 30% in relation to the diameter of a beam bundle of the imaging light in the pupil plane. Such a central pupil obscuration may merely lead to a small loss of imaging light throughput in the region of the pupil centre. The central pupil obscuration may be at most 24% or at most 23% of the diameter of the beam bundle of imaging light in the mechanically accessible pupil.

In some embodiments, the imaging optics has a maximum wavefront error of 70 mλ, and/or the imaging optics has a maximum distortion of 10 nm. Such imaging parameters can lead to an advantageously precise imaging. The maximum wave-front error may be 50 mλ and may be 20 mλ, λ in each case designating the wavelength of the imaging light.

A division of the imaging optics into an unobscured and an obscured part objective system can simplify the design of the imaging optics.

A catoptric imaging optics can avoid chromatic imaging errors.

When using an imaging optics as a projection optics and within an optical system, the advantages thereof come to the fore particularly well.

The advantages of a projection exposure installation according to the disclosure correspond to those which were listed above in relation to the imaging optics according to the disclosure. The light source of the projection exposure installation may be wide band and may, for example have a bandwidth, which is greater than 1 nm, which is greater than 10 nm or which is greater than 100 nm. In addition, the projection exposure installation can be configured such that it can be operated with light sources of different wavelengths. Light sources for other wavelengths, in particular used for microlithography, can also be used in conjunction with the imaging optics according to the disclosure, for example light sources with the wavelengths 365 nm, 248 nm, 193 nm, 157 nm, 126 nm, 109 nm and, in particular, also with wavelengths, which are less than 100 nm, for example between 5 nm and 30 nm.

The light source of the projection exposure installation may be configured to produce illumination light with a wavelength of between 5 nm and 30 nm. A light source of this type has reflection coatings on the mirrors which, in order to fulfil a minimum reflectivity, only have a small angle of incidence acceptance bandwidth. Together with the imaging optics according to the disclosure, a small angle of incidence acceptance bandwidth can be fulfilled.

Corresponding advantages apply to a production method according to the disclosure and the microstructured component produced thereby.

BRIEF DESCRIPTION OF THE DRAWINGS

Embodiments of the disclosure will be described in more detail below with the aid of the drawings, in which.

DETAILED DESCRIPTION

Figure 1:
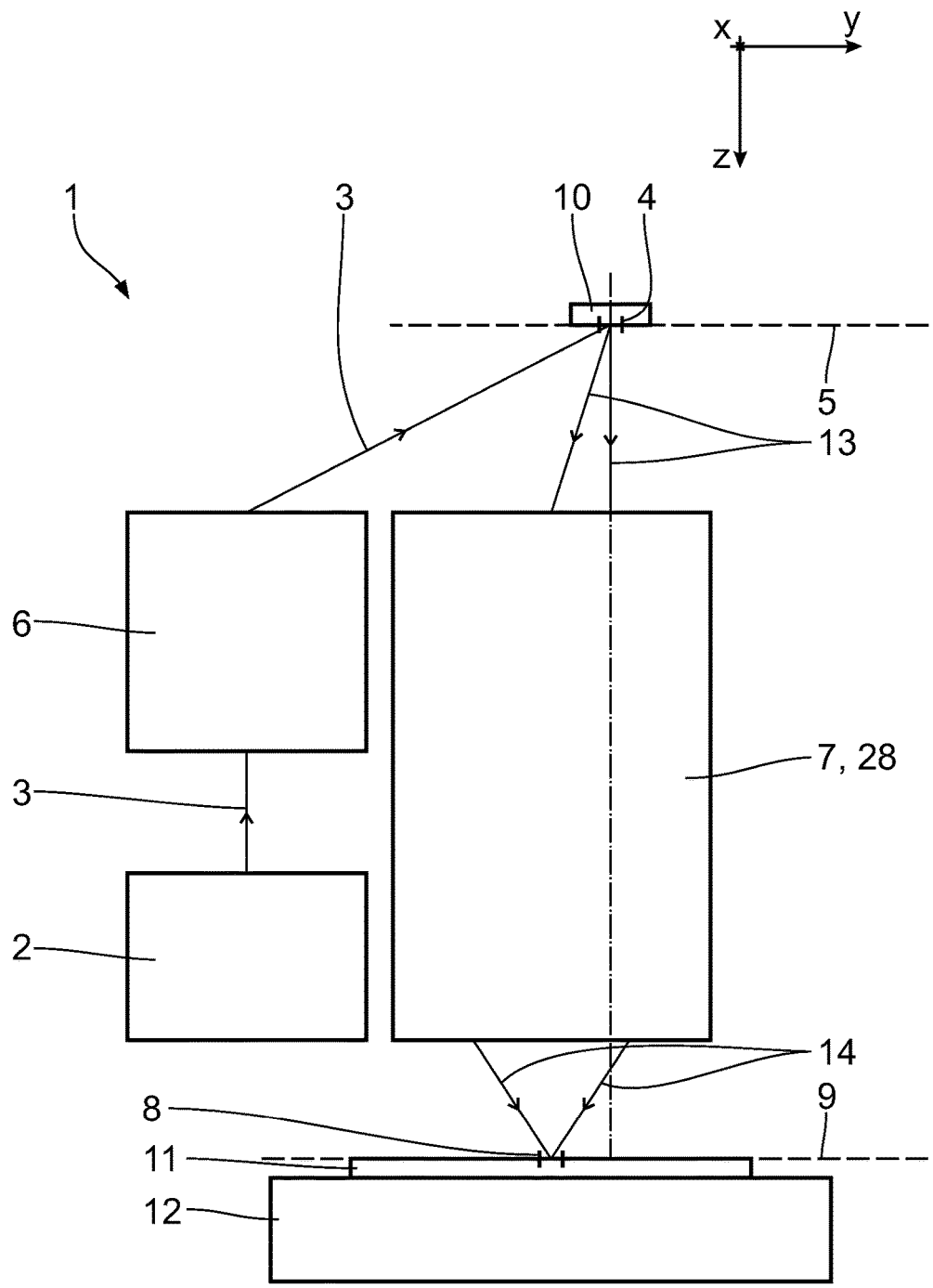
FIG. 1 schematically shows a projection exposure installation for EUV microlithography.

A projection exposure installation 1 for microlithography has a light source 2 for illumination light or imaging light 3. The light source 2 is an EUV light source, which produces light in a wavelength range of, for example, between 5 nm and 30 nm, in particular between 5 nm and 15 nm. The light source 2 may, in particular, be a light source with a wavelength of 6.9 nm or else a light source with a central wavelength of 13.5 nm. Other EUV wavelengths are also possible. In general, any wavelengths, for example, visible wavelengths or else other wavelengths, which can be used in microlithography and are available for suitable laser light sources and/or LED light sources (for example 365 nm, 248 nm, 193 nm, 157 nm, 129 nm, 109 nm) are even possible for the illumination light 3 guided in the projection exposure installation 1. A beam path of the illumination light 3 is shown highly schematically in FIG. 1.

An illumination optics 6 is used to guide the illumination light 3 from the light source 2 toward an object field 4 in an object plane 5. Using a projection optics or imaging optics 7, the object field 4 is imaged in an image field 8 in an image plane 9 at a predetermined reduction scale. The image field 8 has an extent of 13 mm in the x-direction and an extent of 1 mm in the y-direction. One of the embodiments shown in FIG. 2ff. can be used for the projection optics 7. The projection optics 7 according to FIG. 2 reduces by a factor of 8. Other reduction scales are also possible, for example 4×, 5× or else reduction scales which are greater than 8×. An imaging scale of 8× is suitable, in particular, for the illumination light 3 with an EUV wavelength as an angle of incidence on the object side on a reflection mask 10 can thereby be kept small. An imaging scale of 8× does not lead to using very large masks either. The image plane 9 in the projection optics 7 in the configurations according to FIG. 2ff. is arranged parallel to the object plane 5. A detail of the reflection mask 10 coinciding with the object field 4 is imaged here, and is also called a reticle.

Figure 2:
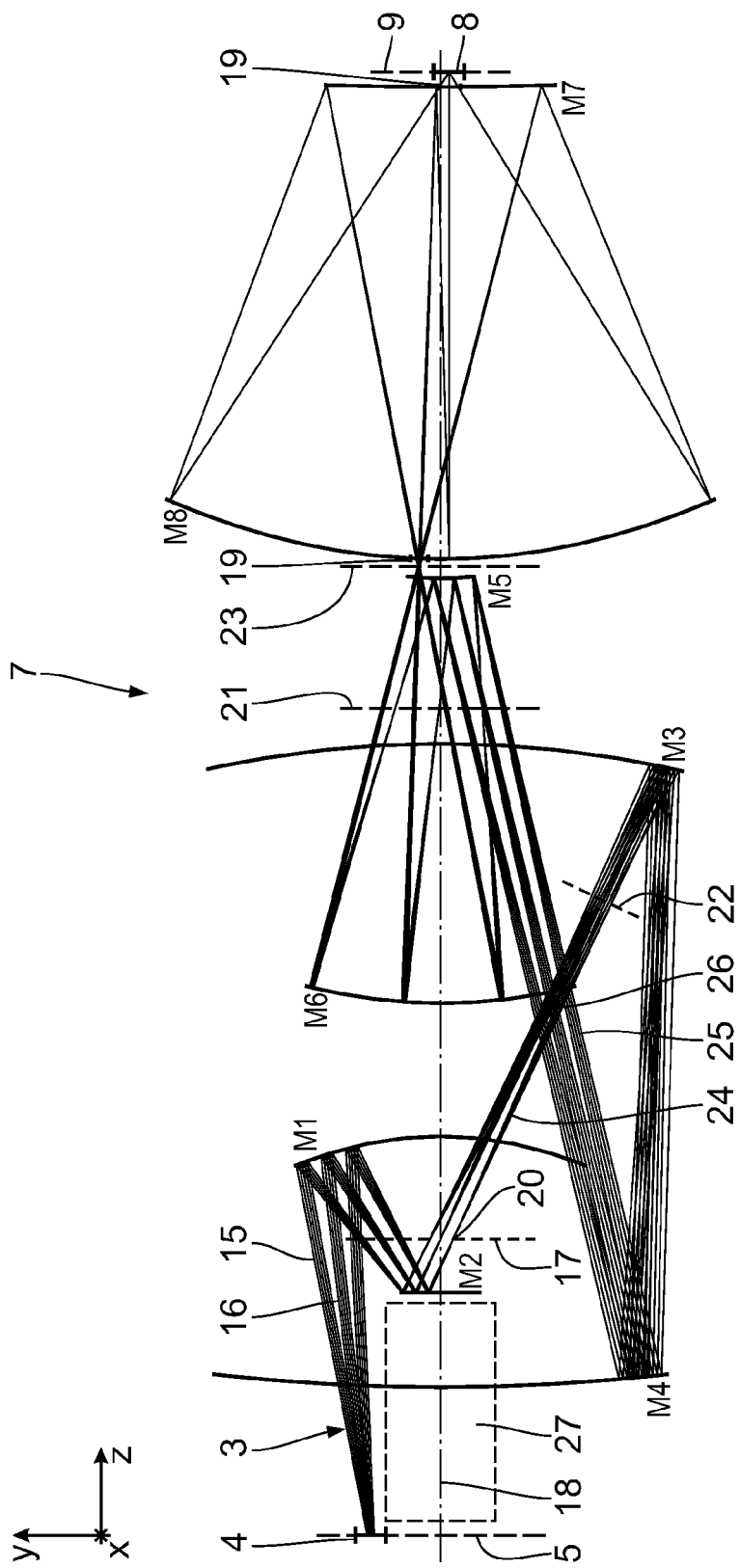
FIG. 2 shows a configuration of an imaging optics, which can be used as a projection objective in the projection exposure installation according to FIG. 1, the imaging beam path being shown for the chief rays (virtually) and for the upper and lower coma beam of three selected field points.

The imaging by the projection optics 7 takes place on the surface of a substrate 11 in the form of a wafer, which is carried by a substrate holder 12. Shown schematically in FIG. 1 between the reticle 10 and the projection optics 7 is a beam bundle 13, which runs therein, of the illumination light 3, and a beam bundle 14 of illumination light 3 issuing from the projection optics 7 between the projection optics 7 and the substrate 11. A numerical aperture, on the image field side, of the projection optics 7 in the configuration according to FIG. 2 is 0.50. This is not depicted to scale in FIG. 1.

To facilitate the description of the projection exposure installation 1 and the various configurations of the projection optics 7, a Cartesian xyz-coordinate system is given in the drawing, from which the respective position relationship of the components shown in the figures is produced. In FIG. 1, the x-direction runs perpendicularly to the drawing plane and into it. The y-direction extends to the right and the z-direction extends downward.

The projection exposure installation 1 is of the scanner type. Both the reticle 10 and the substrate 11 are scanned during operation of the projection exposure installation 1 in the y-direction. A stepper type of the projection exposure installation 1, in which a stepwise displacement of the reticle 10 and substrate 11 takes place in the y-direction between individual exposures of the substrate 11, is also possible.

Figure 3:
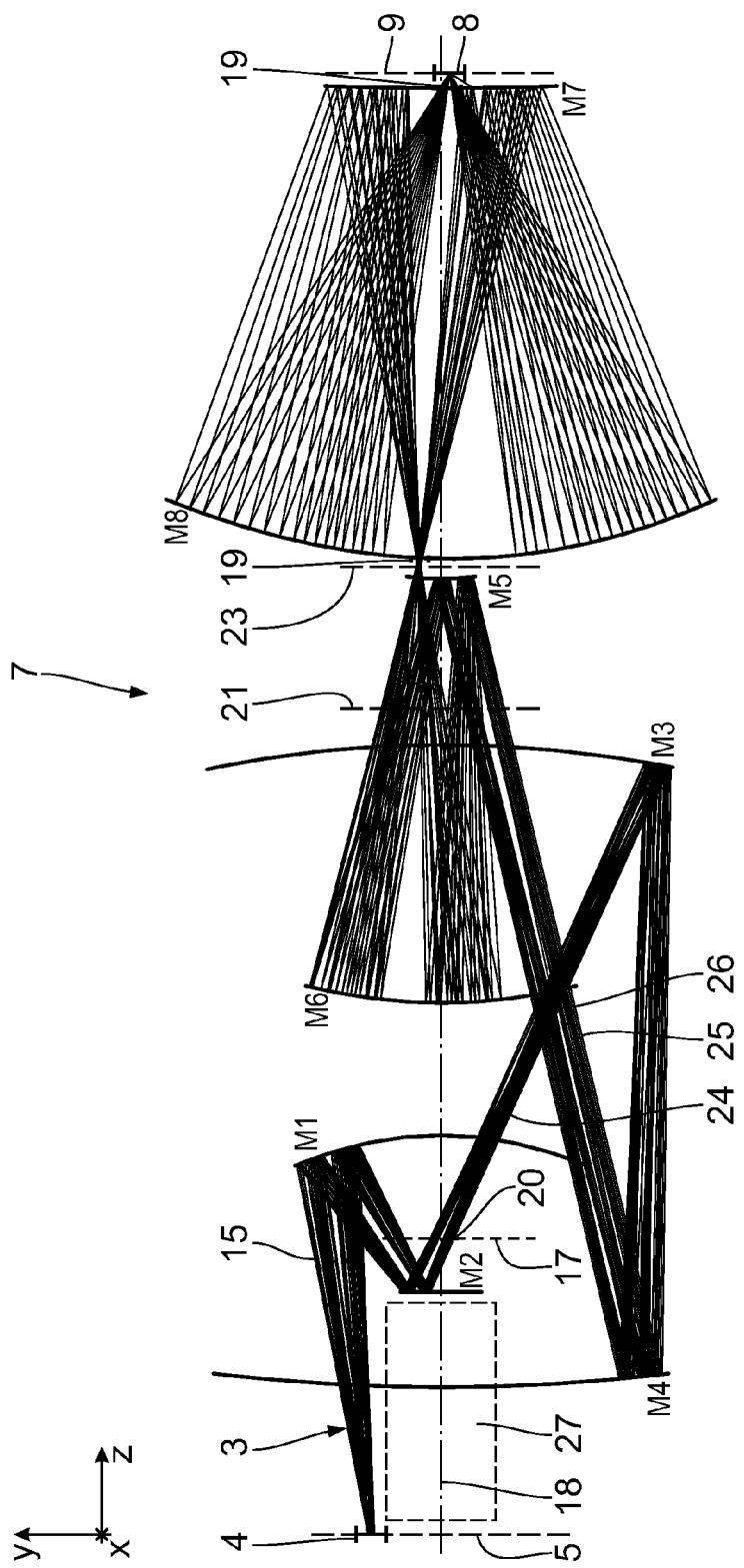
FIG. 3 shows the imaging optics according to FIG. 2, wherein the real imaging beam path is shown for a variety of individual beams.

FIGS. 2 and 3 show the optical design of a first embodiment of the projection optics 7. The beam path of three respective individual beams 15, which emanate from five object field points spaced apart from one another in FIG. 2 in the y-direction, is shown in FIG. 2. The three individual beams 15, which belong to one of these five object field points, are in each case associated with three different illumination directions for the two object field points. Chief rays or main beams 16, which extend through the centre of a pupil in a pupil plane 17 of the projection optics 7, are drawn in FIG. 2 only for graphical reasons as these are not real, but virtual imaging beam paths of the projection optics 7 because of the central pupil obscuration. These chief rays 16 firstly run divergently, starting from the object plane 5. This will also be called the negative back focus of an entry pupil of the projection optics 7 below. The entry pupil of the projection optics 7 according to FIGS. 2 and 3 does not lie within the projection optics 7, but in the beam path in front of the object plane 5. This makes it possible, for example, to arrange a pupil component of the illumination optics 6 in the entry pupil of the projection optics 7 in the beam path in front of the projection optics 7, without further imaging optical components having to be present between this pupil component and the object plane 5. A mirror acting merely to deflect beams, for example a mirror for grazing incidence, may also be arranged between the pupil component and the object plane 5, for example, in this case of the arrangement of a pupil component of the illumination optics 6 in the entry pupil of the projection optics 7, without intermediate imaging optical components.

The projection optics 7 according to FIGS. 2 and 3 has a total of eight mirrors, which are consecutively numbered in the order of the beam path of the individual beams 15, proceeding from the object field 4, by M1 to M8. FIGS. 2 and 3 show the calculated reflection faces of the mirrors M1 to M8. Only a small region of these calculated reflection faces is used, as can be seen in the view of FIG. 2. Only this actually used region of the reflection faces is present in the real mirrors M1 to M8. These useful reflection faces are carried in a known manner by mirror bodies.

The optical data of the projection optics 7 according to FIGS. 2 and 3 are shown below with the aid of two tables. The first table shows in the column "Radius" the respective radius of curvature of the mirrors M1 to M8. The third column (Thickness) describes the spacing, proceeding from the object plane 5, in each case from the following surface in the z-direction.

The second table describes the precise surface form of the reflection faces of mirrors M1 to M8, wherein the constants K and A to G are to be inserted in the following equation for the arrow height z:

$$z(h) = = \frac{ch^2}{1 + SQRT\{1 - (1 + K)c^2h^2\}} + + Ah^4 + Bh^6 + Ch^8 + Dh^{10} + Eh^{12} + Fh^{14} + Gh^{16}$$

h is the spacing here from an optical axis 18 of the projection optics 7. $h^2 = x^2 + y^2$ thus applies. The reciprocal value of "Radius" is inserted for c.

| Surface | Radius (1/c) | Thickness | Processing mode |
|---|---|---|---|
| Object plane | INFINITE | 543.757 | |
| M1 | −449.236 | −211.269 | REFL |
| M2 | −381.481 | 71.127 | REFL |
| STOP | INFINITE | 678.094 | |
| M3 | −1293.655 | 878.647 | REFL |
| M4 | 2575.518 | 1103.024 | REFL |
| M5 | 340.443 | 577.829 | REFL |
| M6 | 659.115 | 1250.269 | REFL |
| M7 | 2394.266 | 642.054 | REFL |
| M8 | 817.414 | 663.527 | REFL |
| Image plane | INFINITE | 0.000 | |

| Surface | K | A | B | C |
|---|---|---|---|---|
| M1 | 0.000000E+00 | −2.460293E−10 | −1.269784E−15 | 2.803303E−21 |
| M2 | 0.000000E+00 | 6.386979E−08 | −2.318025E−12 | 6.696092E−17 |
| M3 | 0.000000E+00 | 9.799571E−11 | −1.514496E−15 | 1.015677E−20 |
| M4 | 0.000000E+00 | −1.251897E−11 | −1.029828E−15 | 6.301813E−21 |
| M5 | 0.000000E+00 | 2.958312E−08 | 5.028056E−13 | 8.066658E−18 |
| M6 | 0.000000E+00 | 2.017168E−11 | −2.275527E−17 | −9.166209E−23 |
| M7 | 0.000000E+00 | 1.252401E−09 | 4.102615E−15 | 2.060274E−20 |
| M8 | 0.000000E+00 | 2.416984E−11 | 5.199686E−17 | 8.459189E−23 |

-continued

| Surface | D | E | F | G |
| --- | --- | --- | --- | --- |
| M1 | 1.652701E−25 | 0.000000E+00 | 0.000000E+00 | 0.000000E+00 |
| M2 | −4.001704E−21 | 0.000000E+00 | 0.000000E+00 | 0.000000E+00 |
| M3 | −2.679237E−26 | 0.000000E+00 | 0.000000E+00 | 0.000000E+00 |
| M4 | −1.577707E−26 | 0.000000E+00 | 0.000000E+00 | 0.000000E+00 |
| M5 | −4.143857E−21 | 0.000000E+00 | 0.000000E+00 | 0.000000E+00 |
| M6 | 5.861325E−28 | 0.000000E+00 | 0.000000E+00 | 0.000000E+00 |
| M7 | 1.022964E−25 | 1.423250E−30 | 0.000000E+00 | 0.000000E+00 |
| M8 | 1.424018E−28 | 1.255450E−34 | 7.241285E−40 | 0.000000E+00 |

The object field 4 and the image field 8 are arranged in a ring segment-shape around the optical axis 18. The mirrors M1 to M4 are used approximately in a ring segment-shaped manner and off-axis in relation to the optical axis 18. The used optical reflection face of the mirrors M1 to M4 is thus remote from the optical axis 18. The object field 4 and the image field 8 are arranged spaced apart from the optical axis 18. The reflection faces of all the mirrors M1 to M8 are rotationally symmetrical according to the above equation for the arrow height z in relation to the optical axis 18. Alternatively, it is possible for the mirrors M1 to M8 to have deviations from a rotationally symmetrical shape.

The mirrors M1, M3, M4, M6 and M8 are configured as concave mirrors. The mirrors M2, M5 and M7 are configured as convex mirrors.

The mirrors M1 and M6 and M5 and M8 are arranged back-to-back with regard to the orientation of their reflection faces.

The optically used regions of the mirrors M1 to M6 have no through-opening for the passage of imaging light, in other words are not obscured.

In the imaging beam path between the mirrors M6 and M7, the individual beams 15 pass through a through-opening 19 in the mirror M8. The mirror M8 around the through-opening 19 is used. The mirror M8 is thus an obscured mirror. Apart from the mirror M8, the mirror M7 is also obscured and also in each case has a virtually central through-opening 19. The through-opening 19 of the mirror M7 is passed through by the imaging light 3 in the imaging beam path between the mirror M8 and the image field 8, shortly before reaching the image field 8.

The pupil plane 17 is located in the imaging beam path in the projection optics 7 between the mirrors M2 and M3. The pupil plane 17 is located in the imaging beam path between the object field 4 and the through-opening 19 of the mirror M8. Arranged in the pupil plane 17 is an obscuration stop 20 for central shading of a pupil of the projection optics 7. The pupil in the pupil plane 17 is arranged mechanically accessibly for this purpose. The obscuration stop 20 shades that central region of the imaging light 3 in the pupil plane 17 which, because of the through-openings 19, does not contribute to the imaging of the object field 4. An obscuration stop of this type may be held mechanically, for example, by thin metal struts, which block a minimal part of the imaging light (cf FIG. 7d in US 2006/0232867 A1). A further alternative for a mechanical holder is shown in FIG. 7b from the application US 2006/0232867 A1.

The obscuration stop 20 is only indicated in FIGS. 2 and 3. An optical effect of the obscuration stop 20 is illustrated by FIG. 3, in which the real imaging beam path through the projection optics 7 is shown with the aid of a selected variety of the individual beams 15. It can clearly be seen in FIG. 3 that a central region of the variety of the individual beams 15 is shaded in the imaging beam path around the obscuration stop 20. This central shading can also be seen in the region of the further pupil planes in the imaging beam path between the object field 4 and the image field 8. One of these further pupil planes, the pupil plane 21, is located in the imaging beam path between the mirrors M5 and M6. The central shading effect of the obscuration stop 20 in the region of an exit pupil of the projection optics 7 can furthermore be seen in the region of the imaging beam path in the mirrors M7 and M8.

A first intermediate image plane 22 of the projection optics 7 is located in the imaging beam path between the mirrors M2 and M3 after the pupil plane 17. Between the pupil plane 21 and the exit pupil of the projection optics 7, a second intermediate image plane 23 is located in the imaging beam path between the mirrors M6 and M7. The second intermediate image is located in the second intermediate image plane 23 closely adjacent to the through-opening 19 in the mirror M8. As a result, it is possible to make this through-opening 19 very small in comparison to the used reflection face of the mirror M8. A central pupil obscuration in the projection optics 7 is 24% of the diameter of the entire beam bundle of imaging light 3 in the pupil plane 17. Accordingly, only 5.76% of the cross sectional area of the beam bundle of imaging light 3 is shaded there.

A first imaging part beam 24 in the projection optics 7 runs between the mirrors M2 and M3. A second imaging part beam 25 runs between the mirrors M4 and M5. These two imaging part beams 24, 25 intersect one another in an intersection region 26. This intersection region is spatially adjacent to the mirror M6.

In addition to the obscuration stop 20, an aperture stop can also be arranged in the pupil plane 17 to predetermine an outer form of the pupil of the projection optics 7. The obscuration stop 20 may, in particular, additionally have the function of an aperture stop of this type.

The obscuration stop 20 and the aperture stop also arranged in the pupil plane 17 are in each case a stop which is run through precisely once by the imaging beam path.

The second mirror M2 in the imaging beam path is further away from the object plane 5 than the fourth mirror M4 in the imaging beam path. As a result, provided between the second mirror M2 and the object field 4 is an installation space 27 which is shown by dashed lines in FIG. 2, in which, for example, a mirror of the illumination optics 6, in particular a grazing-incidence mirror can be arranged. A cylinder can be written into the installation space 27, the rotational axis of symmetry of which coincides with the optical axis 18. A z-extent of this installation space cylinder is more than 16% of the entire installation length of the projection optics 7, in other words the spacing between the object plane 5 and the image plane 9. A radius of this installation space cylinder has a y-dimension that corresponds to the y-spacing of the object field 4 from the optical axis 18.

The projection optics 7 has a correction of the wavefront of about 13 mλ at a wavelength of the imaging light of 13 nm.

The projection optics 7 has a maximum distortion of 5 nm.

The projection optics 7 is constructed from a first, unobscured part objective with the mirrors M1 to M6, in other words with mirrors without a through-opening for the imaging light 3, and a second part objective with the mirrors M7, M8 with the through-openings 19 for the imaging light 3.

The projection optics 7 is a catoptric optical system, in other words an optical system exclusively configured with mirrors M1, M8.

Figure 4:
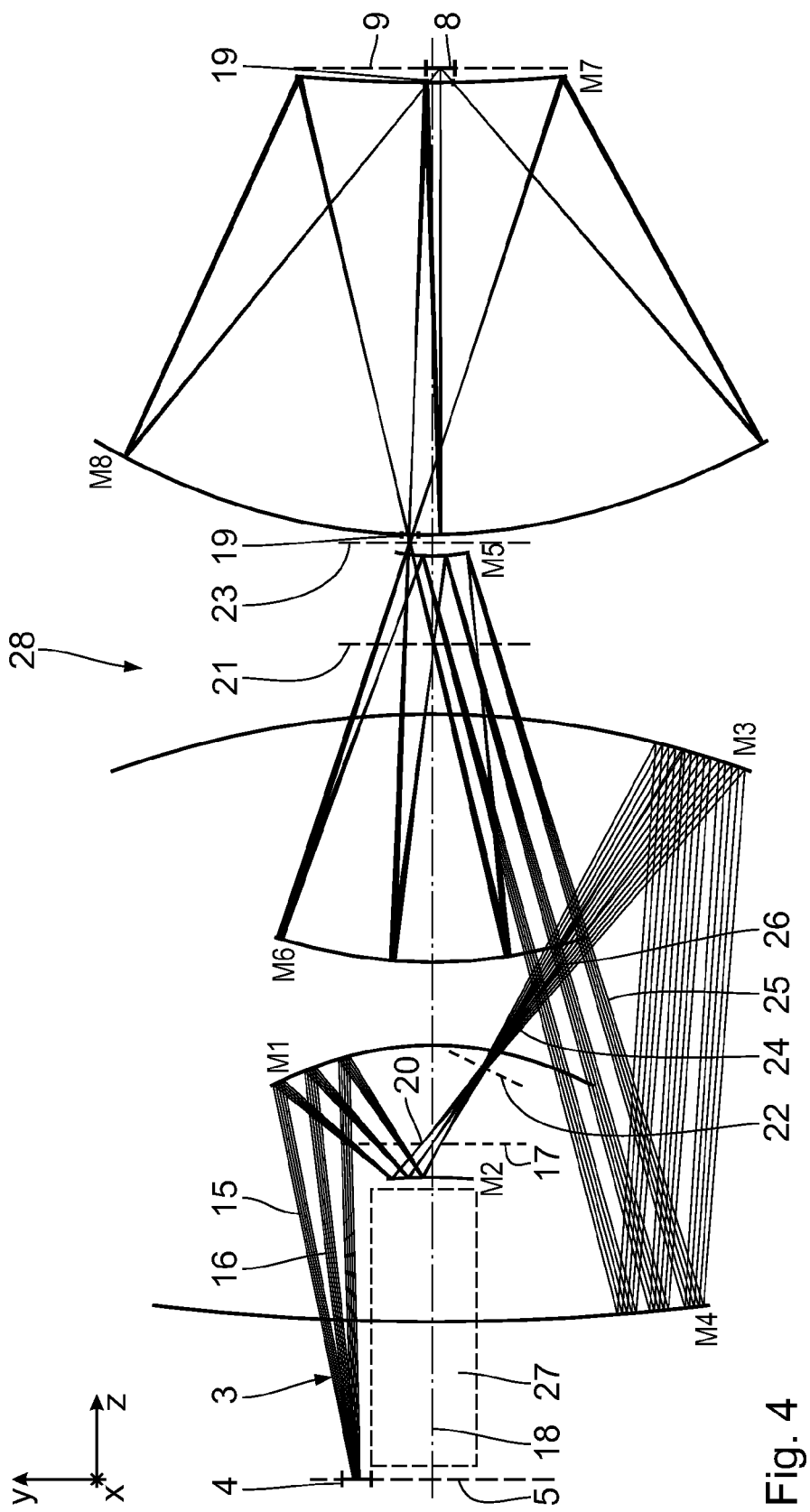
FIG. 4 shows, in a view similar to FIG. 2, a further configuration of an imaging optics, which can be used as a projection objective in a projection exposure installation according to FIG. 1.
Figure 5:
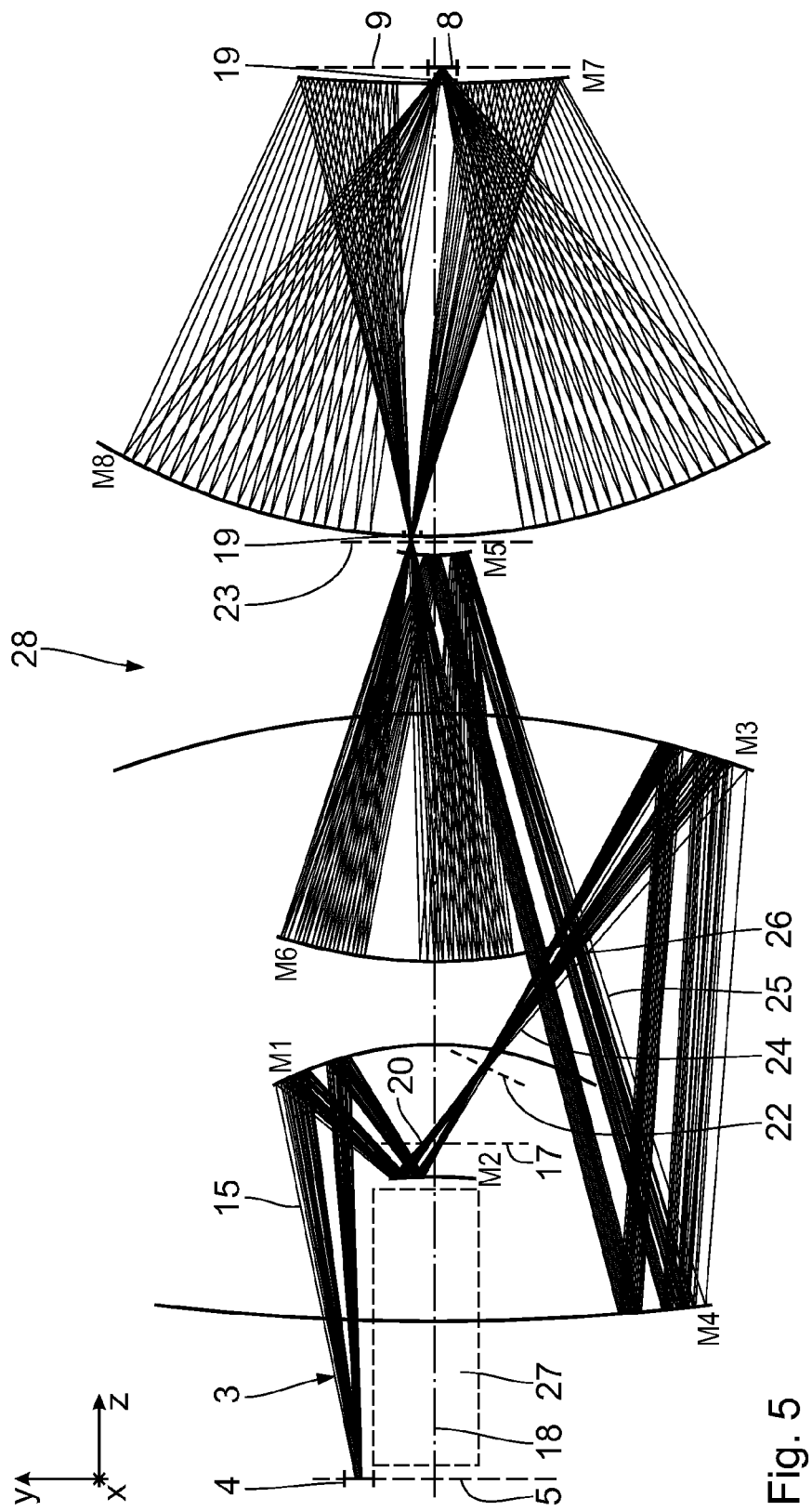
FIG. 5 shows the imaging optics according to FIG. 4, in a view similar to FIG. 3.

FIGS. 4 and 5 show a further embodiment of a projection optics 28, which can be used instead of the projection optics 7 in the projection exposure installation 1. Components and details corresponding to those which have already been described with reference to FIGS. 1 to 3 have the same reference numerals and are not discussed again in detail.

The optical data of the projection optics 28 are shown below with the aid of two tables, which with regard to the structure, correspond to the Tables for the projection optics 7.

beam bundle of imaging light 3 and correspondingly 5.29% of the cross sectional area there of the beam bundle of imaging light 3.

Imaging part beams adjacent to the beam bundle of imaging light 3 in the pupil plane 17 are spaced so far apart form the beam bundle of imaging light 3 passing through the pupil plane 17 that an aperture stop of this type can be arranged mechanically in the pupil plane 17 without the aperture stop obstructing the adjacent imaging part beams.

The installation space cylinder which can be written into the installation space 27, in the projection optics 28, has a z-extent, which is about 18% of the total installation length of the projection optics 28 between the object plane 5 and the image plane 9.

To produce a microstructured or nanostructured component, the projection exposure installation 1 is used as follows: firstly, the reflection mask 10 or the reticle and the substrate or the wafer 11 are provided. A structure on the reticle 10 is then projected onto a light-sensitive layer of the wafer 11 with the aid of the projection exposure installation. By developing the light-sensitive layer, a microstructure or nanostructure is then produced on the wafer 11 and therefore the microstructured component is produced.

| Surface | Radius (1/c) | Thickness | Processing mode |
| --- | --- | --- | --- |
| Object plane | INFINITE | 613.559 | |
| M1 | −406.659 | −187.587 | REFL |
| M2 | −422.395 | 48.314 | REFL |
| STOP | INFINITE | 609.274 | |
| M3 | −1159.498 | −861.821 | REFL |
| M4 | 2575.518 | 1085.195 | REFL |
| M5 | 277.079 | −573.822 | REFL |
| M6 | 656.425 | 1245.415 | REFL |
| M7 | 2489.088 | −641.593 | REFL |
| M8 | 817.507 | 663.067 | REFL |
| Image plane | INFINITE | 0.000 | |

| Surface | K | A | B | C | D |
| --- | --- | --- | --- | --- | --- |
| M1 | 0.000000E+00 | 4.087938E−10 | 2.211846E−15 | 2.636371E−20 | 4.868396E−26 |
| M2 | 0.000000E+00 | 8.742259E−08 | −4.355110E−12 | −3.666477E−18 | 9.255361E−21 |
| M3 | 0.000000E+00 | −2.698572E−11 | −1.517420E−16 | 1.014742E−21 | −3.986399E−27 |
| M4 | 0.000000E+00 | −1.486765E−10 | −2.068756E−16 | 8.454470E−23 | −3.789880E−27 |
| M5 | 0.000000E+00 | 2.357073E−08 | −1.037369E−13 | −4.242200E−17 | −3.626310E−21 |
| M6 | 0.000000E+00 | 1.218200E−10 | 3.610597E−16 | 8.927849E−22 | 1.195427E−27 |
| M7 | 0.000000E+00 | 9.462055E−10 | 2.671043E−15 | 1.215091E−20 | 6.632766E−26 |
| M8 | 0.000000E+00 | 1.444201E−11 | 3.962539E−17 | 7.092908E−23 | 9.439764E−29 |

| Surface | E | F | G | H | J |
| --- | --- | --- | --- | --- | --- |
| M1 | 1.965381E−30 | 5.703202E−35 | 0.000000E+00 | 0.000000E+00 | 0.000000E+00 |
| M2 | 3.701762E−28 | 5.285209E−29 | 0.000000E+00 | 0.000000E+00 | 0.000000E+00 |
| M3 | 8.916733E−33 | −8.213059E−39 | 0.000000E+00 | 0.000000E+00 | 0.000000E+00 |
| M4 | 2.834304E−32 | −1.746649E−38 | 0.000000E+00 | 0.000000E+00 | 0.000000E+00 |
| M5 | −3.431867E−27 | 1.134085E−29 | 0.000000E+00 | 0.000000E+00 | 0.000000E+00 |
| M6 | 2.779912E−32 | −1.010642E−37 | 0.000000E+00 | 0.000000E+00 | 0.000000E+00 |
| M7 | 1.448402E−31 | 5.788876E−36 | 0.000000E+00 | 0.000000E+00 | 0.000000E+00 |
| M8 | 3.225231E−34 | −4.237434E−40 | 1.980412E−45 | 0.000000E+00 | 0.000000E+00 |

In the projection optics 28, the first intermediate image plane 22 in the imaging beam path is closer to the pupil plane 17 than in the projection optics 7.

The projection optics 28 has a numerical aperture on the image side of NA=0.60.

In the projection optics 28, the correction of the wavefront is about 16 mλ. The projection optics 28 has a maximum distortion of 0.7 nm.

A central pupil obscuration in the projection optics 28, for example in the pupil plane 17, is 23% of the diameter of the

What is claimed is:

1. An imaging optics, comprising:
   at least six mirrors configured to image an object field in an object plane into an image field in an image plane along a path of imaging light,
   wherein:
   chief rays of the imaging light, which emanate from points of the object field which are spaced apart from one another, have a mutually diverging beam course;
   of the at least six mirrors, a mirror has a through-opening which is the first through-opening: a) after the object plane along the path of the imaging light; and b) configured to pass the imaging light along the path of the imaging light;

a pupil is located in a pupil plane in the path of the imaging light between the object field and the first through-opening;

the imaging light passes once through the pupil along the path of the imaging light;

an obscuration stop is arranged in the pupil plane to provide central shading of an exit pupil of the imaging optics;

a first imaging part beam is directly after a second mirror in the path of the imaging light after the object field;

a second imaging part beam is directly after a fourth mirror in the path of the imaging light after the object field; and the first and second imaging parts intersect each other in an intersection region.

2. The imaging optics of claim 1, wherein the imaging optics comprises exactly eight mirrors.

3. The imaging optics of claim 1, further comprising an aperture stop configured to determine an outer form of the pupil, wherein the aperture stop is in the pupil plane.

4. The imaging optics of claim 1, wherein the plurality of mirrors comprises a third mirror in the path of the imaging light after the object field, and the pupil plane is between the second and third mirrors in the path of the imaging light after the object field.

5. The imaging optics of claim 1, wherein the second mirror in the path of the imaging light is further away from the object plane than is the fourth mirror in the path of the imaging light.

6. The imaging optics of claim 1, wherein two intermediate image planes are in the path of the imaging light between the object field and the image field.

7. The imaging optics of claim 6, wherein the plurality of mirrors comprises a third mirror in the path of the imaging light after the object field, and the first intermediate image plane is between the second mirror and the third mirror in the path of the imaging light.

8. The imaging optics of claim 6, wherein the plurality of mirrors comprises a sixth mirror in the path of the imaging light after the object field, and the second intermediate image plane is between the sixth mirror and a seventh mirror in the path of the imaging light.

9. The imaging optics of claim 6, wherein the imaging optics is a microlithography projection optics.

10. The imaging optics of claim 1, wherein the imaging optics has a central pupil obscuration of at most 30% relative to a diameter of a beam bundle of the imaging light in the pupil plane.

11. The imaging optics of claim 1 wherein the imaging optics has a maximum wavefront error of 70 m$\lambda$.

12. The imaging optics of claim 1, wherein the imaging optics has a maximum distortion of 10 nm.

13. The imaging optics of claim 1, comprising:
a first part objective comprising mirrors, all mirrors in the first part objective being without through-openings configured to pass the imaging light; and a second part objective comprising at least one mirror with a through-opening configured to pass the imaging light.

14. The imaging optics of claim 1, wherein the imaging optics is a catoptric optical system.

15. The imaging optics of claim 1, wherein the imaging optics is a microlithography projection optics.

16. An optical system, comprising:
a microlithography projection optics having an object field in an object plane and an image field in an image plane; and
an illumination optics configured to guide illumination light toward the object field of the microlithography projection optics, wherein:
the microlithography projection optics comprises at least six mirrors configured to image the object field in the object plane of the microlithography projection optics into the image field in the image plane of the microlithography projection optics along a path of imaging light;

chief rays of the imaging light, which emanate from points of the object field which are spaced apart from one another, have a mutually diverging beam course;

of the at least six mirrors, a mirror has a through-opening which is the first through-opening: a) after the object field along the path of the imaging light; and b) configured to pass the imaging light along the path of the imaging light;

a pupil is located in a pupil plane in the path of the imaging light between the object field and the first through-opening;

the imaging light passes once through the pupil along the path of the imaging light;

an obscuration stop is arranged in the pupil plane to provide central shading of an exit pupil of the imaging optics;

a first imaging part beam is directly after a second mirror in the path of the imaging light after the object field;

a second imaging part beam is directly after a fourth mirror in the path of the imaging light after the object field; and the first and second imaging parts intersect each other in an intersection region.

17. The optical system of claim 16, further comprising a light source configured to provide the imaging light.

18. The optical system of claim 17, wherein the imaging light has a wavelength of between 5 and 30 nm.

19. A method, comprising:
providing an optical system according to claim 16; and
using the optical system to project a structure of a reticle onto a light-sensitive layer of a wafer to provide an exposed light-sensitive layer on the wafer.

20. The method of claim 19, further comprising developing the exposed light-sensitive layer on the wafer to provide a microstructured component or a nanostructured component.

* * * * *

UNITED STATES PATENT AND TRADEMARK OFFICE
CERTIFICATE OF CORRECTION

PATENT NO. : 9,639,004 B2
APPLICATION NO. : 13/218962
DATED : May 2, 2017
INVENTOR(S) : Hans-Juergen Mann It is certified that error appears in the above-identified patent and that said Letters Patent is hereby corrected as shown below:

In the Specification

Column 2, Line 46, delete "de-limit" and insert -- delimit --.

Column 6, Lines 35-39, delete "
$$z(h) = \frac{ch^2}{1 + SQRT\{1 - (1+K)c^2h^2\}} + Bh^6 + Ch^8 + Dh^{10} + Eh^{12} + Fh^{14} + Gh^{16}$$
" and insert --
$$z(h) = \frac{ch^2}{1 + SQRT\{1 - (1+K)c^2h^2\}} + Ah^4 + Bh^6 + Ch^8 + Dh^{10} + Eh^{12} + Fh^{14} + Gh^{16}$$
--.

Column 10, Line 6, delete "form" and insert -- from --.

Signed and Sealed this
Twenty-second Day of August, 2017

Joseph Matal
*Performing the Functions and Duties of the
Under Secretary of Commerce for Intellectual Property and
Director of the United States Patent and Trademark Office*